United States Patent
Uchibori

(10) Patent No.: US 9,280,622 B2
(45) Date of Patent: Mar. 8, 2016

(54) CIRCUIT VERIFYING APPARATUS, CIRCUIT VERIFYING METHOD, AND CIRCUIT VERIFYING PROGRAM

(71) Applicant: NEC Corporation, Minato-ku, Tokyo (JP)

(72) Inventor: Shusaku Uchibori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/301,499

(22) Filed: Jun. 11, 2014

(65) Prior Publication Data

US 2014/0372962 A1     Dec. 18, 2014

(30) Foreign Application Priority Data

Jun. 14, 2013 (JP) ................. 2013-125611

(51) Int. Cl.
G06F 17/50 (2006.01)
(52) U.S. Cl.
CPC ................... G06F 17/5027 (2013.01)
(58) Field of Classification Search
CPC .................................................. G06F 17/5027
USPC ......................................... 716/106, 111, 136
See application file for complete search history.

(56) References Cited

U.S. PATENT DOCUMENTS

| | | | | |
|---|---|---|---|---|
| 7,162,674 B2* | 1/2007 | Nozuyama | ...................... | 714/741 |
| 7,464,015 B2* | 12/2008 | Iwashita | ..................... | 703/15 |
| 7,502,728 B1* | 3/2009 | Hurlock et al. | ................. | 703/23 |
| 8,166,463 B2* | 4/2012 | Gill et al. | ...................... | 717/130 |
| 8,196,119 B2* | 6/2012 | Gill et al. | ...................... | 717/130 |
| 2009/0089771 A1* | 4/2009 | Gill et al. | ...................... | 717/158 |

FOREIGN PATENT DOCUMENTS

| | | |
|---|---|---|
| JP | 2000-98001 A | 4/2000 |
| JP | 2003-196342 A | 7/2003 |
| JP | 2007-122422 A | 5/2007 |
| JP | 2008-134808 A | 6/2008 |
| JP | 2010-44622 A | 2/2010 |
| JP | 2010-67160 A | 3/2010 |
| JP | 2011-138428 A | 7/2011 |
| WO | 2008/038617 A1 | 4/2008 |

OTHER PUBLICATIONS

Hiroshi Izawa, "Hardware Description Language (No. 1)—A Design Method and its Feature—(from Logic Circuit 2)", Faculty of Engineering of Shinshu University, Internet <URL:http://laputa.cs.shinshu-u.ac.jp/~yizawa/logic2/chap10/>, [retrieved on Jun. 4, 2014].

(Continued)

*Primary Examiner* — Sun Lin

(57) ABSTRACT

A circuit verifying apparatus, which calculates code coverage of a measurement-target logic circuit written in a hardware description language, including: a coverage observing unit which measures whether a code corresponding to a measurement-target signal extracted from each of plural observation points, which are arranged inside the measurement-target logic circuit, is carried out or not; and a coverage collecting unit which collects measurement results acquired by the coverage observing unit, and measures quantitatively a ratio of tested codes to whole codes which describe the measurement-target logic circuit, and outputs the ratio.

11 Claims, 5 Drawing Sheets

(56) References Cited

OTHER PUBLICATIONS

Masaki Kase, "Summary of Code Coverage (from a Study Room for a Software Test)", Mar. 12, 2008, Internet <URL:http://softest.cocolog-nifty.com/blog/2008/03/post_7864.html>, [retrieved on Jun. 4, 2014].

Nikkei BP, "What is assertion base verification? (from revised edition EDA terminology dictionary)", Jan. 13, 2009, Corporation Nikkei BP, Internet <URL:http://techon.nikkeibp.co.jp/article/WORD/20090107/163733/>, [retrieved on Jun. 4, 2014].

Japanese Office Action for JP Application No. 2013-125611 mailed on Jul. 1, 2014 with English Translation.

* cited by examiner (TO COVERAGE COLLECTING UNIT 12)

Fig. 4

221 DESCRIPTION IN HARDWARE DESCRIPTION LANGUAGE

```
wire aaa always @(posedge clk)
        FF<=aaa;                              — S201 always @(posedge clk)
        if(aaa & !FF)Rise<=1;                 — S202 always @(posedge clk)
        if(!aaa & FF)Fall<=1;                 — S203

...
```

CIRCUIT VERIFYING APPARATUS, CIRCUIT VERIFYING METHOD, AND CIRCUIT VERIFYING PROGRAM

CROSS-REFERENCE TO RELATED APPLICATIONS

This application is based upon and claims the benefit of priority from Japanese Patent Application Publication No. 2013-125611, filed on Jun. 14, 2013, the disclosure of which is incorporated herein in its entirety by reference.

TECHNICAL FIELD

The present invention relates to a circuit verifying apparatus, a circuit verifying method, a circuit verifying program, and particularly relates to a circuit verifying apparatus or the like which reduces a test verification miss in an actual machine test.

BACKGROUND ART

A circuit scale of LSI (Large Scale Integrated Circuit) becomes large year by year, and furthermore it is requested to make a design time short. Moreover, an electronic circuit, whose circuit operation can be described by a program, such as FPGA (Field Programmable Gate Alley) is prevailing. As a result, it becomes a general way nowadays to design a logic circuit by use of not a circuit diagram but a hardware description language (HDL: Hardware Description Language).

In verifying a logic circuit which is written in the hardware description language, code coverage (code coverage ratio) is used as an index of test coverage properties or a degree of verification accuracy. The code coverage represents a ratio of executed codes, among codes (instruction sentence, branch, path, and the like)

Particularly, in the case of verifying the logic circuit which is written in the hardware description language, it is a general way to carry out a simulation test before carrying out an actual test. As an index indicating degree of how much is carried out for the simulation test, the code coverage is used.

As a related art, a patent document 1 discloses an art which, when verifying a function of a logic circuit of a system LSI, by detecting an unexpected-operation test pattern, prevents the code coverage from being missed A patent document 2 discloses an art which, when verifying a LSI design, for an emulation whose code coverage cannot be measured directly, transforms the code coverage into the assertion language which is a description language for verifying a LSI function, and measures the code coverage.

A patent document 3 discloses a test simplifying circuit which outputs a signal, which is outputted from an observation point arranged on a tested circuit, to a compression circuit, and connects an output of the compression circuit with a flip-flop. A patent document 4 discloses an LSI design verifying apparatus which enables to measure the code coverage by storing a signal connection relation in a common database and using the signal connection relation. A patent document 5 discloses a circuit design system which determines an observation point by extracting a candidate which may be caused failure.

A patent document 6 discloses a test method which improves the test coverage properties by use of the assertion checker for monitoring the test. A patent document 7 discloses a verification apparatus which extracts a coverage point group from a hardware program on the basis of semantic interpretation, and carries out a logical simulation by use of the coverage point group. Non-patent documents 1 to 3 explain terminologies of the hardware description language (HDL), the code coverage and the assertion language.

PRECEDING TECHNICAL DOCUMENT

Patent Document

[Patent document 1] Japanese Patent Application Laid-open Publication No. 2008-134808
[Patent document 2] Japanese Patent Application Laid-open Publication No. 2010-067160
[Patent document 3] Japanese Patent Application Laid-open Publication No. 2000-098001
[Patent document 4] Japanese Patent Application Laid-open Publication No. 2003-196342
[Patent document 5] Japanese Patent Application Laid-open Publication No. 2007-122422
[Patent document 6] Japanese Patent Application Laid-open Publication No. 2010-044622
[Patent document 7] Japanese Patent Application Laid-open Publication No. 2011-138428

Non-Patent Document

[Non-patent document 1] Hiroshi Izawa "Hardware description language (No. 1)—A design method and its feature—(from logic circuit 2)" [searched on Jun. 7, 2013], Faculty of Engineering of Shinshu University, Internet <URL: http://laputa.cs.shinshu-u.ac.jp/~yizawa/logic2/chap10/index. html>
[Non-patent document 2] Masaki Kase, "Summary of code coverage (from a study room for a software test)", Mar. 9, 2008, [searched on Jun. 7, 2013], Internet <URL:http://softest.cocolog-nifty.com/blog/2008/03/post_7864.html>
[Non-patent document 3] "What is assertion base verification? (from revised edition EDA terminology dictionary)", Jan. 13, 2009, [searched on Jun. 7, 2013], Corporation Nikkei BP, Internet URL:http://techon.nikkeibp.co.jp/article/WORD/20090107/163733/SUMMARY

SUMMARY

Problem to be Solved by the Invention

A circuit scale of LSI becomes large year by year, and it is also requested simultaneously to reduce TAT (Turn Around Time) which is needed for a LSI design. As a result, there are many cases that verification miss of the LSI circuit may be caused, and consequently quality of the LSI circuit may be degraded.

As a test which is carried out before fabricating a circuit actually, there is a method which makes an index value of the code coverage close to 100% in order to reduce the verification miss of the logic circuit which is written in the hardware description language.

However, it is impossible to calculate the code coverage in the actual test which is carried out after the circuit is fabricated actually, and furthermore there is no effective index value which replaces the code coverage. For this reason, the method, which uses the code coverage as the index value, cannot be used in the actual test. The actual test has no way other than carrying out the test according to predetermined test items, and an objective standard on the test coverage properties does not exist.

An art which can solve the problem is not disclosed in the patent documents 1 to 7 and the non-patent documents 1 to 3 mentioned above.

An object of the present invention is to provide a circuit verifying apparatus, a circuit verifying method, and a circuit verification program which are able to acquire an index value indicating the test coverage properties objectively even in the actual test of the logic circuit.

Means to Solve the Problem

In order to achieve the above-mentioned object, a circuit verifying apparatus, which calculates code coverage of a measurement-target logic circuit written in a hardware description language, including: a coverage observing unit which measures whether a code corresponding to a measurement-target signal extracted from each of plural observation points, which are arranged inside said measurement-target logic circuit, is carried out or not; and a coverage collecting unit which collects measurement results acquired by said coverage observing unit, and measures quantitatively a ratio of tested codes to whole codes which describe said measurement-target logic circuit, and outputs said ratio.

In order to achieve the above-mentioned object, a circuit verifying method, which uses a circuit verifying apparatus calculating code coverage of a measurement-target logic circuit written in a hardware description language, including: extracting a measurement-target signal from each of plural observation points which are arranged inside said measurement-target logic circuit; measuring whether a code corresponding to said measurement-target signal is carried out or not; collecting said measurement results; and making said coverage collecting unit measure quantitatively a ratio of tested codes to whole codes which describe said measurement-target logic circuit, and output said ratio.

In order to achieve the above-mentioned object, a non-transitory computer-readable computer medium storing a circuit verifying program, which is loaded in a circuit verifying apparatus calculating code coverage of a measurement-target logic circuit which is written in a hardware description language, makes a processor of said circuit verifying apparatus carry out: a procedure of extracting a measurement-target signal from each of plural observation points which are arranged inside said measurement-target logic circuit; a procedure of measuring whether a code corresponding to said measurement-object signal is carried out or not; a procedure to collect results of measuring whether each said code is carried out or not; and a procedure of measuring quantitatively a ratio of tested codes to whole codes which describe said measurement-target logic circuit, and outputting said ratio.

Effect of the Invention

According to the present invention, it is possible to acquire the index value, which indicates the test coverage properties objectively, even in the actual test of the logic circuit.

BRIEF DESCRIPTION OF THE DRAWINGS

FIG. 4 is an explanation diagram showing an operation in which a measurement circuit adding unit shown in FIG. 3 adds a coverage observing unit to a measurement-target logic circuit.

EXEMPLARY EMBODIMENT

Hereinafter, an exemplary embodiment according to the present invention will be described with reference to a drawing.

A code

First Exemplary Embodiment

A circuit verifying apparatus 10 of a first exemplary embodiment of the present invention will be described with reference to a drawing.

Figure 1:
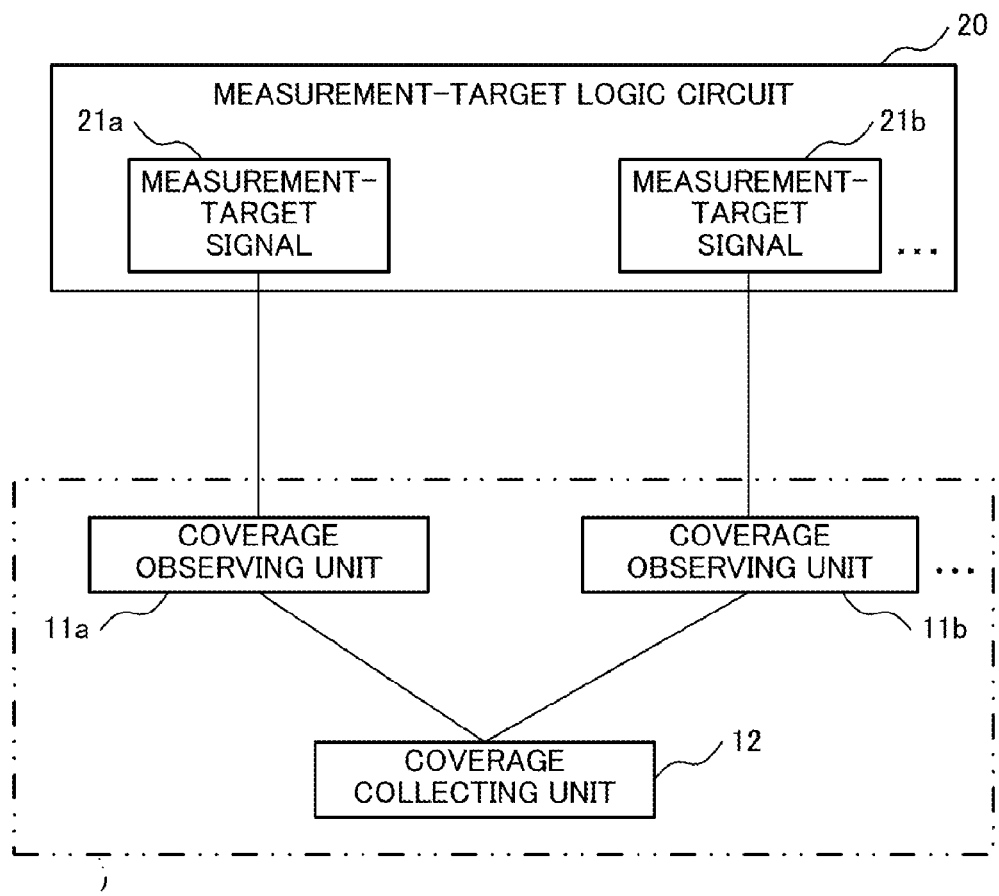
FIG. 1 is an explanation diagram showing a configuration of a circuit verifying apparatus according to a first exemplary embodiment of the present invention.

FIG. 1 is an explanation diagram showing a configuration of the circuit verifying apparatus 10 according to the first exemplary embodiment of the present invention. The circuit verifying apparatus 10 of the first exemplary embodiment is an apparatus which calculates code coverage of a measurement-target logic circuit 20 which is written in the hardware description language. The circuit verifying apparatus 10 includes coverage observing unit 11a, 11b . . . , and coverage collecting unit 12a, 12b . . . . The inside of the measurement-target logic circuit 20 includes a plurality of observation points which are used for extracting measurement-target signals 21a, 21b . . . . The coverage observing unit 11a, 11b . . . of the circuit verifying apparatus 10 measure whether codes corresponding to the measurement-target signals 21a, 21b . . . , which are extracted from the observation points respectively, are carried out or not. Since the coverage observing unit 11a, 11b . . . have a common configuration respectively, the coverage observing unit 11a, 11b . . . will be called a coverage observing unit 11 collectively in the following description. Similarly, the measurement-target signals 21a, 21b . . . , which are provided to the coverage observing unit 11 called collectively, are called a measurement-target signal 21 collectively. Moreover, a coverage collecting unit 12 of the circuit verifying apparatus 10 collects measurement results, which the coverage observing unit 11 acquires respectively, and measures quantitatively a ratio of tested codes to whole codes which describe the measurement-target logic circuit, and outputs the ratio.

The circuit verifying apparatus 10 extracts a plurality of the measurement-target signals 21 of the measurement-target logic circuit 20, and tests a state of the measurement-target logic circuit 20. The measurement-target signal 21 includes, at least, a final output signal of the logic circuit. Moreover, the measurement-target signal 21 may include a signal extracted from an observation point which is arranged inside the measurement-target logic circuit 20 for the test.

Figure 2:
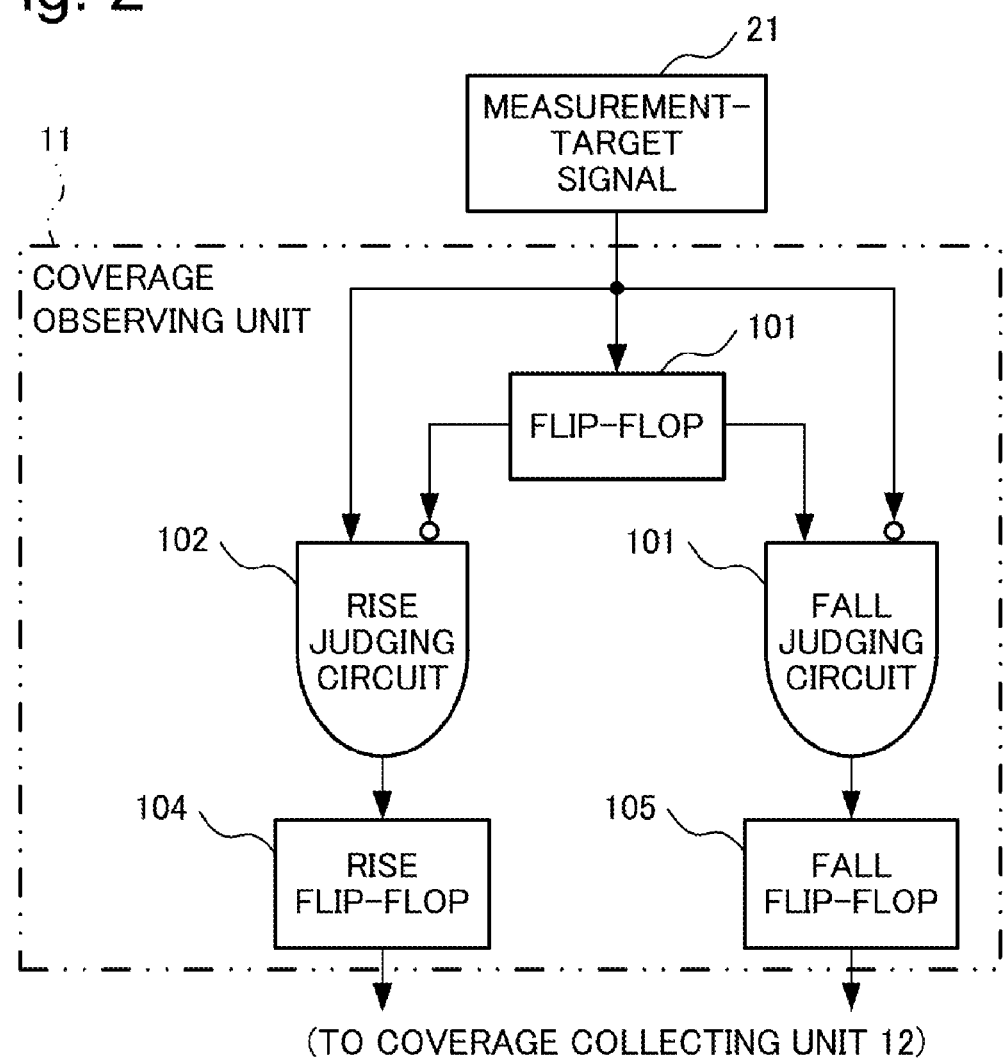
FIG. 2 is an explanation diagram showing a more detailed configuration of a coverage observing unit shown in FIG. 1.

FIG. 2 is an explanation diagram showing a more detailed configuration of the coverage observing unit 11 shown in FIG. 1

The coverage observing unit 11 includes a flip-flop 101 holding a value which the measurement-target signal 21 has before one clock, a rise judging circuit 102 which outputs a logical product of a value of the measurement-target signal 21 and a logical inverse of the value of the flip-flop 101, a fall judging circuit 103 which outputs a logical product of a logical inverse of the value of the measurement-target signal 21 and the value of the flip-flop 101, a rise flip-flop 104 which holds the output value of the rise judging circuit 102, and a fall flip-flop 105 which holds the output value of the fall judging circuit 103.

Here, "rise" means that the value of the measurement-target signal 21 changes from "0" to "1" during one clock interval, and "fall" means that the value of the measurement-target signal 21 changes from "1" to "0" during one clock interval. Since the flip-flop 101 holds the value which the measurement-target signal 21 has before one clock, it is possible to detect the rise and the fall.

The coverage collecting unit 12 collects the output values which are held by the rise flip-flop 104 and the fall flip-flop 105, and detects whether the rise or the fall is caused or not. As a result, it is possible to know the test coverage.

Operation and Effect of First Exemplary Embodiment

Next, an operation of the above-mentioned exemplary embodiment will be described.

A circuit verifying method according to the exemplary embodiment uses the circuit verifying apparatus which calculates the code coverage of the measurement-target logic circuit which is written in the hardware description language. According to the method, the circuit verifying apparatus extracts the measurement-target signals from a plurality of observation points respectively which are arranged inside the measurement-target logic circuit, and measures whether the code corresponding to the measurement-target signal is carried out or not, and collects the measurement results, and measures quantitatively the ratio of the tested codes to the whole codes which describe the measurement-target logic circuit, and outputs the ratio.

Moreover, a process of measuring whether the code corresponding to the measurement-target signal is carried out or not is carried out as follows. That is, a first flip-flop holds the value which the measurement-target signal has before one clock, and the rise judging circuit outputs a logical product of a current value of the measurement-target signal and a logical inverse of the value of the first flip-flop, and a second flip-flop holds the output value of the rise judging circuit. Furthermore, the fall judging circuit outputs a logical product of a logical inverse of the current value of the measurement-target signal and the value of the first flip-flop, and a third flip-flop holds the output value of the fall judging circuit.

Moreover, a process of collecting the measurement results outputted by the coverage observing unit is a process of collecting output values of the second flip-flop and the third flip-flop. Moreover, a process of measuring quantitatively the ratio of the tested codes to the whole codes is a process of summing up whether a signal value at the observation point is changed or not on the basis of the collected output values.

Here, each process mentioned above may be programmed so as to be carried out by a computer apparatus, and a processor of the circuit verifying apparatus, which carries out each process directly, may carry out each process. The program may be recorded in a non-temporary recording medium such as DVD, CD, a flash memory or the like. In this case, a computer reads the program from a recording medium, and executes the program.

By virtue of the operation mentioned above, the exemplary embodiment has the following effect.

According to the exemplary embodiment, it is possible in the actual test to calculate the code coverage of the measurement-target logic circuit, while the existing art cannot calculate the code coverage of the measurement-target logic circuit. Needless to say, the code coverage can be an objective number which indicates the coverage of the test carried out to the measurement-target logic circuit.

Second Exemplary Embodiment

In addition to the configuration of the circuit verifying apparatus 10 which is shown as the first exemplary embodiment, a circuit verifying apparatus 210 according to a second exemplary embodiment of the present invention includes furthermore a configuration having newly a measurement circuit adding unit 213 which is used for adding the coverage observing unit 11 and the coverage collecting unit 12 to the description on the measurement-target logic circuit written in the hardware description language.

In addition to the second exemplary embodiment has a same effect of the first exemplary embodiment, the second exemplary embodiment can make a time for verifying a logic circuit shorter. Moreover, it is possible to respond flexibly to various requests related to the verification of the logic circuit.

Hereinafter, the above will be described more in detail.

Figure 3:
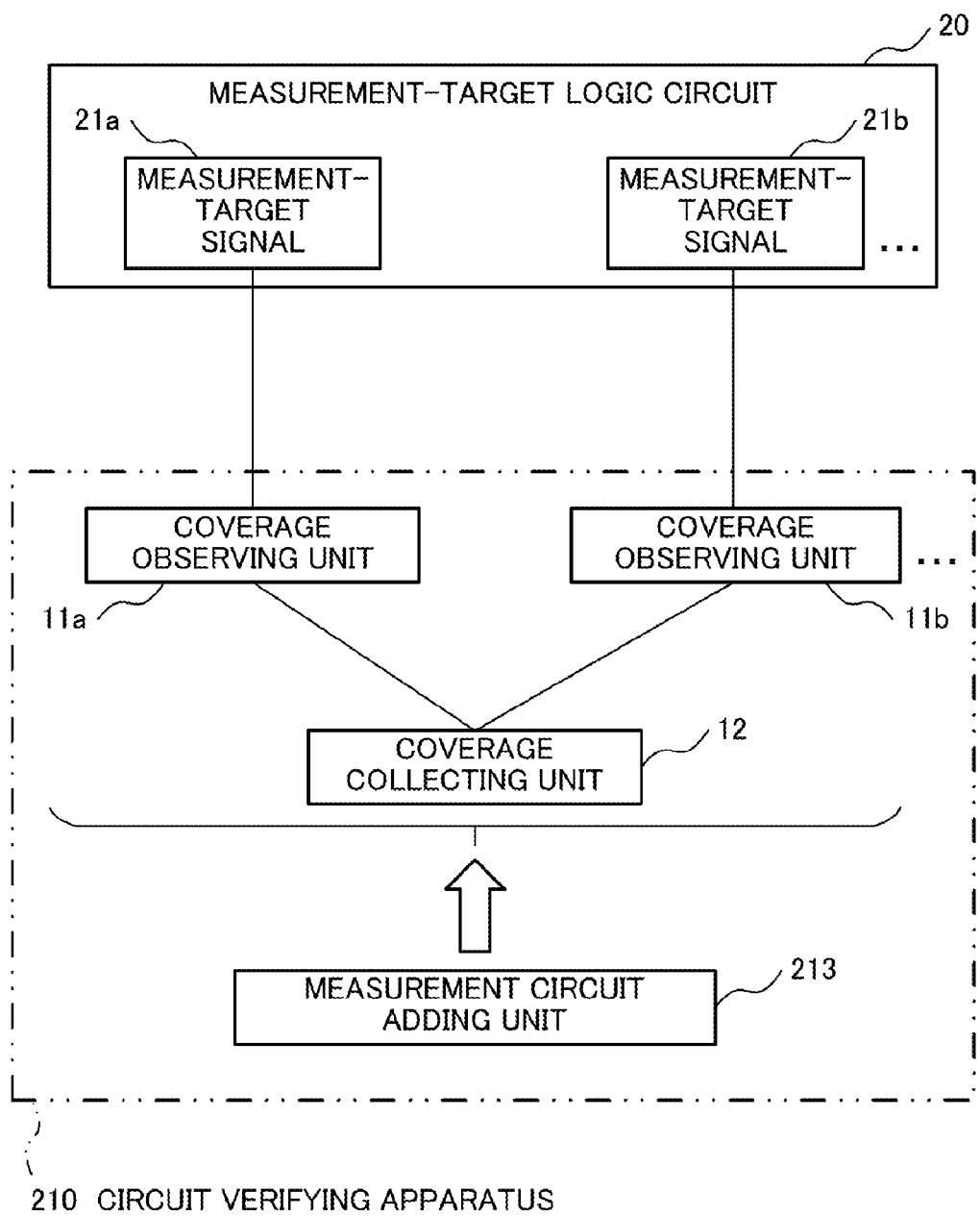
FIG. 3 is an explanation diagram showing a configuration of a circuit verifying apparatus according to a second exemplary embodiment of the present invention.

FIG. 3 is an explanation diagram showing the configuration of the circuit verifying apparatus 210 according to the second exemplary embodiment of the present invention. The circuit verifying apparatus 210 is different from the circuit verifying apparatus 10 of the first exemplary embodiment in a point that the circuit verifying apparatus 210 includes the measurement circuit adding unit 213 in addition to the coverage observing unit 11 and the coverage collecting unit 12 which are identical with the coverage observing unit 11 and the coverage collecting unit 12 of the circuit verifying apparatus 10.

The measurement circuit adding unit 213 adds description on the coverage observing unit 11 and the coverage collecting unit 12 to the description on the measurement-target logic circuit 20 written in the hardware description language. According to the updated description, each unit is generated, and consequently an operation identical with the operation of the first exemplary embodiment is realized.

FIG. 4 is an explanation diagram showing an operation in which the measurement circuit adding unit 213 shown in FIG. 3 adds the coverage observing unit 11 to the measurement-target logic circuit 20. FIG. 4 shows description 221 on the measurement-target logic circuit 20 written in the hardware description language (verilog HDL) and the measurement-target signal 21 in the description 221 is indicated as "aaa".

The measurement circuit adding unit 213 adds the flip-flop 101 shown in FIG. 2 to "aaa" which is corresponding to the measurement-target signal 21 of the measurement-target logic circuit 20 (S201). Next, the measurement circuit adding unit 213 adds the rise judging circuit 102 which outputs the logical product of the value of the measurement-target signal 21 and the logical inverse of the value of the flip-flop 101, and the rise flip-flop 104 which holds the output value of the rise judging circuit 102 (S202). Furthermore, the measurement circuit adding unit 213 adds the fall judging circuit 103 which outputs the logical product of the logical inverse of the value of the measurement-target signal 21 and the value of the flip-flop 101, and the fall flip-flop 105 which holds the output value of the fall judging circuit 103 (S203)

Here, while description on the operation of adding the coverage collecting unit 12 is omitted, the operation is similar to the operation shown in FIG. 4. Moreover, a hardware description language other than the verilog HDL can be used similarly to the above.

Furthermore, in the case that the measurement-target logic circuit 20 is fabricated by FPGA, the measurement circuit adding unit 213 may delete the coverage observing unit 11 and the coverage collecting unit 12 when the measurement of the code coverage is completed. As a result, it is also possible that FPGA with large capacity is used at a stage when the code coverage is measured, and FPGA with small capacity is used at a stage when the measurement is completed and the product is shipped. Moreover, it is also possible to measure the code coverage of not a whole of the logic circuit but a part of the logic circuit.

By virtue of the above, the exemplary embodiment can make the time for verifying the logic circuit shorter, and can respond flexibly to various requests related to the verification of the logic circuit.

Hardware Configuration

Figure 5:
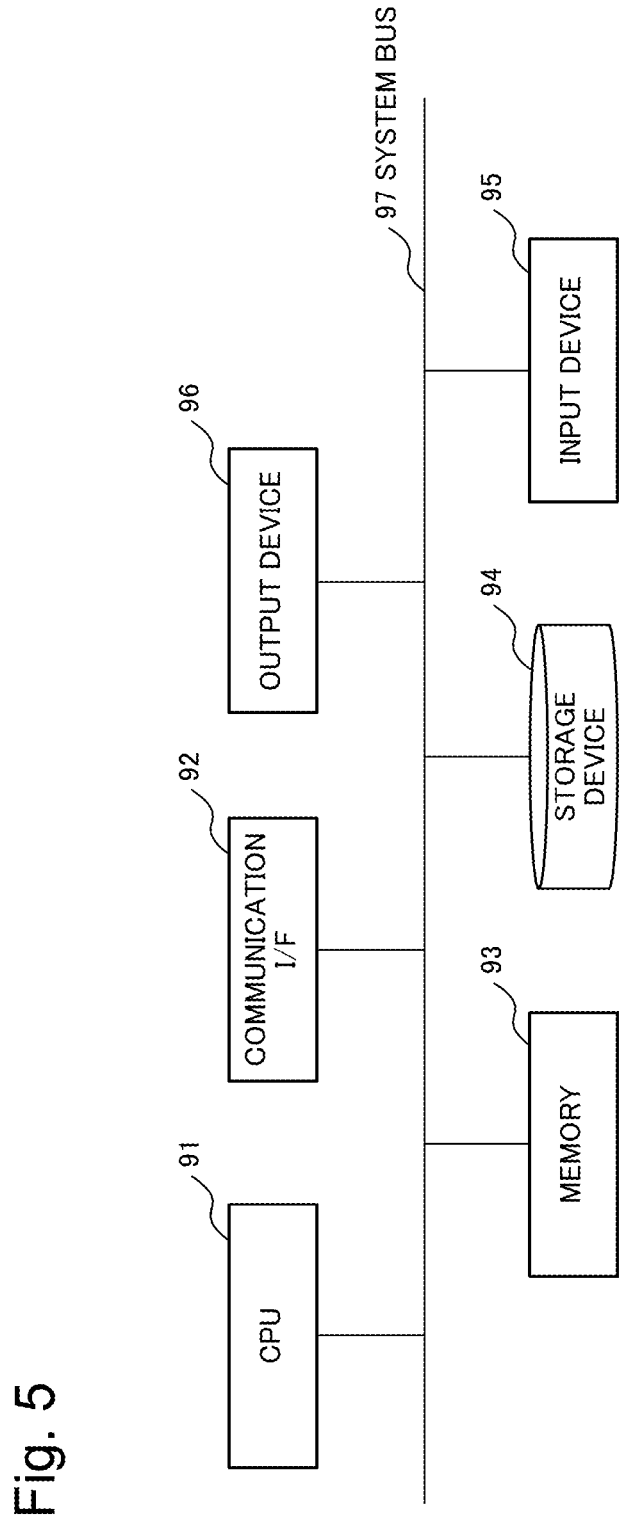
FIG. 5 is an explanation diagram showing a hardware configuration which realizes the circuit verifying apparatus according to the first or the second exemplary embodiment of the present invention by use of a computer apparatus.

FIG. 5 is an explanation diagram showing a hardware configuration which realizes the circuit verifying apparatus according to the first or the second exemplary embodiment of the present invention by use of a computer apparatus.

As shown in FIG. 5, the computer apparatus includes CPU (Central Processing Unit) 91, a communication I/F (InterFace) 92 for a network connection, a memory 93 and a storage device 94, which stores a program, such as a hard disk. Furthermore, the computer apparatus includes an input device 95 and an output device 96 through a system bus 97.

CPU 91 controls the circuit verifying apparatus according to the first and the second exemplary embodiments of the present invention by operating an operating system. Moreover, CPU 91 reads a program and data, for example, from a recording medium which is mounted on a drive device, and inputs the program and the data in the memory 93.

Moreover, CPU 91 has, for example, a function of processing an information signal which is inputted from the coverage observing unit of the circuit verifying apparatus according to each exemplary embodiment, and processes the various functions on the basis of the program.

The storage device 94 is, for example, an optical disc, a flexible disc, a magnetic optical disc, an external hard disk, a semiconductor memory or the like. A storage medium, which is a part of the storage device 94, is a non-volatile storage device, and stores the program. Moreover, the program is connected with a communication network. Then, the program may be downloaded from an external computer which is not shown in the figure.

The input device 95, which is realized, for example, by a mouse, a key board, a built-in key button, an inlet for card, a touch panel or the like, is used for an input operation.

The output device 96, which is realized, for example, by a display, is used for outputting and checking information or the like which is processed by CPU 91.

As mentioned above, each exemplary embodiment of the present invention is realized with the hardware configuration shown in FIG. 5. However, a unit which realizes each unit included in the circuit verifying apparatus has no particular limitation. That is, the circuit verifying apparatus may be realized by one apparatus which combines other apparatuses, or may be realized by a plurality of apparatuses which are separated each other physically and are connected each other through a wire or a wireless.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. Any configuration which has been known can be adopted as far as the configuration has the effect of the present invention.

A summary of new technical contents of the exemplary embodiment mentioned above will be as follows. Here, while a part of or a whole of the above-mentioned exemplary embodiment is summarized as follows as a new art, the present invention is not always limited to the summary.

Note (Note 1) A circuit verifying apparatus, which calculates code coverage of a measurement-target logic circuit written in a hardware description language, including: a coverage observing unit which measures whether a code corresponding to a measurement-target signal extracted from each of plural observation points, which are arranged inside said measurement-target logic circuit, is carried out or not; and a coverage collecting unit which collects measurement results acquired by said coverage observing unit, and measures quantitatively a ratio of tested codes to whole codes which describe said measurement-target logic circuit, and outputs said ratio.

(Note 2) The circuit verifying apparatus according to note 1, wherein said coverage observing unit, comprising: a first flip-flop which holds a value which said measurement-target signal has before one clock; a rise judging circuit which outputs a logical product of a current value of said measurement-target signal and a logical inverse of a value of said first flip-flop; and a second flip-flop which holds an output value of said rise judging circuit.

(Note 3) The circuit verifying apparatus according to note 2, wherein said coverage observing unit, comprising: a fall judging circuit which outputs a logical product of a logical inverse of said current value of said measurement-target signal and said value of said first flip-flop; and a third flip-flop which holds an output value of said fall judging circuit.

(Note 4) The circuit verifying apparatus according to note 3, wherein said coverage observing unit has a function to collect output values which are held by said second flip-flop and said third flip-flop, and to sum up whether a signal value at said observation point is changed or not on the basis of said output values.

(Note 5) The circuit verifying apparatus according to note 1, including: a measurement circuit adding unit which adds said coverage observing unit and said coverage collecting unit to description on said measurement-target logic circuit which is written in said hardware description language.

(Note 6) The circuit verifying apparatus according to note 5, wherein said measurement circuit adding unit has a function of deleting said coverage observing unit and said coverage collecting unit from description on said measurement-target logic circuit, which is written in said hardware description language, after calculation of said code coverage is completed.

(Note 7) A circuit verifying method, which uses a circuit verifying apparatus calculating code coverage of a measurement-target logic circuit written in a hardware description language, including: extracting a measurement-target signal from each of plural observation points which are arranged inside said measurement-target logic circuit;

measuring whether a code corresponding to said measurement-target signal is carried out or not; collecting said measurement results; and making said coverage collecting unit measure quantitatively a ratio of tested codes to whole codes which describe said measurement-target logic circuit, and output said ratio.

(Note 8) The circuit verifying method according to note 6, wherein a process of measuring whether a code corresponding to said measurement-target signal is carried out or not includes that: a first flip-flop holds a value which said measurement-target signal has before one clock; a rise judging circuit outputs a logical product of a current value of said measurement-target signal and a logical inverse of a value of said first flip-flop; and a second flip-flop holds an output value of said rise judging circuit.

(Note 9) The circuit verifying method according to note 7, wherein a process of measuring whether a code corresponding to said measurement-target signal is carried out or not includes furthermore that: a fall judging circuit outputs a logical product of a logical inverse of said current value of said measurement-target signal and said value of said first flip-flop; and a third flip-flop holds an output value of said fall judging circuit.

(Note 10) The circuit verifying method according to note 8, wherein a process of collecting measurement results acquired by said coverage observing unit is a process of collecting output values which are held by said second flip-flop and said third flip-flop; and wherein a process of measuring quantitatively said ratio of said tested codes to said whole codes is a process of summing up whether a signal value at said observation point is changed or not on the basis of said collected output values.

(Note 11) A non-transitory computer-readable computer medium storing a circuit verifying program, which is loaded in a circuit verifying apparatus calculating code coverage of a measurement-target logic circuit which is written in a hardware description language, makes a processor of said circuit verifying apparatus carry out: a procedure of extracting a measurement-target signal from each of plural observation points which are arranged inside said measurement-target logic circuit; a procedure of measuring whether a code corresponding to said measurement-object signal is carried out or not; a procedure to collect results of measuring whether each said code is carried out or not; and a procedure of measuring quantitatively a ratio of tested codes to whole codes which describe said measurement-target logic circuit, and outputting said ratio.

DESCRIPTION OF CODES 1, 10 and 210 circuit verifying apparatus
2 and 20 measurement-target logic circuit
3a, 3b, 21, 21a and 21b measurement-target signal
4a, 4b, 11, 11a and 11b coverage observing unit
5 and 12 coverage collecting unit
91 CPU (Central Processing Unit)
92 communication I/F (InterFace) for network connection
93 memory
94 storage device
95 input device
96 output device
97 system bus
101 flip-flop
102 rise judging circuit
103 fall judging circuit
104 rise flip-flop
105 fall flip-flop
213 measurement circuit adding unit
221 description

The invention claimed is:

1. A circuit verifying apparatus, which calculates code coverage of a measurement-target logic circuit written in a hardware description language, comprising:
   a coverage observing unit which measures whether a code corresponding to a measurement-target signal extracted from each observation point of plural observation points, which are arranged inside said measurement-target logic circuit, is carried out or not; and
   a coverage collecting unit which collects measurement results acquired by said coverage observing unit, and measures quantitatively a ratio of tested codes to whole codes which describe said measurement-target logic circuit, and outputs said ratio.

2. The circuit verifying apparatus according to claim 1, wherein said coverage observing unit, comprising:
   a first flip-flop which holds a value which said measurement-target signal has before one clock;
   a rise judging circuit which outputs a logical product of a current value of said measurement-target signal and a logical inverse of a value of said first flip-flop; and
   a second flip-flop which holds an output value of said rise judging circuit.

3. The circuit verifying apparatus according to claim 2, wherein said coverage observing unit, comprising:
   a fall judging circuit which outputs a logical product of a logical inverse of said current value of said measurement-target signal and said value of said first flip-flop; and
   a third flip-flop which holds an output value of said fall judging circuit.

4. The circuit verifying apparatus according to claim 3, wherein said coverage observing unit has a function to collect output values which are held by said second flip-flop and said third flip-flop, and to sum up whether a signal value at said observation point is changed or not based on said output values.

5. The circuit verifying apparatus according to claim 1, further comprising:
   a measurement circuit adding unit which adds said coverage observing unit and said coverage collecting unit to a description on said measurement-target logic circuit which is written in said hardware description language.

6. The circuit verifying apparatus according to claim 5, wherein said measurement circuit adding unit has a function of deleting said coverage observing unit and said coverage collecting unit from said description on said measurement-target logic circuit, after calculation of said code coverage is completed.

7. A circuit verifying method, which uses a circuit verifying apparatus calculating code coverage of a measurement-target logic circuit written in a hardware description language, comprising:
   extracting a measurement-target signal from each observation point of plural observation points which are arranged inside said measurement-target logic circuit;
   measuring whether a code corresponding to said measurement-target signal is carried out or not;
   collecting measurement results of said measuring; and
   measuring quantitatively a ratio of tested codes to whole codes which describe said measurement-target logic circuit, and outputting said ratio.

8. The circuit verifying method according to claim 7, wherein a process of measuring whether a code corresponding to said measurement-target signal is carried out or not including:

holding a value which said measurement-target signal has before one clock; and outputting a logical product of a current value of said measurement-target signal and a logical inverse of said value which said measurement-target signal has before one clock.

9. The circuit verifying method according to claim 8, Wherein a process of measuring whether a code corresponding to said measurement-target signal is carried out or not further including:

outputting a logical product of a logical inverse of said current value of said measurement-target signal and said value which said measurement-target signal has before one clock.

10. The circuit verifying method according to claim 9, wherein a process of collecting measurement results is a process of collecting output said values and said logical product; and wherein a process of measuring quantitatively said ratio of said tested codes to said whole codes is a process of summing up whether a signal value at said each observation point is changed or not based on said collected output values.

11. A non-transitory computer-readable computer medium storing a circuit verifying program, which is loaded in a circuit verifying apparatus calculating code coverage of a measurement-target logic circuit which is written in a hardware description language, makes a processor of said circuit verifying apparatus carry out:

a procedure of extracting a measurement-target signal from each observation point of plural observation points which are arranged inside said measurement-target logic circuit;

a procedure of measuring whether a code corresponding to said measurement-target signal is carried out or not;

a procedure to collect results of measuring whether each said code is carried out or not; and a procedure of measuring quantitatively a ratio of tested codes to whole codes which describe said measurement-target logic circuit, and outputting said ratio.

\* \* \* \* \*